(12) United States Patent
Kim

(10) Patent No.: US 7,849,431 B2
(45) Date of Patent: Dec. 7, 2010

(54) CMOS INVERTER LAYOUT FOR INCREASING EFFECTIVE CHANNEL LENGTH

(75) Inventor: Min-Su Kim, Hwaseong-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 307 days.

(21) Appl. No.: 11/727,936

(22) Filed: Mar. 29, 2007

(65) Prior Publication Data

US 2007/0235815 A1 Oct. 11, 2007

(30) Foreign Application Priority Data

Apr. 10, 2006 (KR) ...................... 10-2006-0032140

(51) Int. Cl.
*G06F 17/50* (2006.01)
(52) U.S. Cl. .................................. 716/8; 716/9; 716/10
(58) Field of Classification Search .................. 716/1, 716/2, 8–10; 257/202, 204, 206, 369
See application file for complete search history.

(56) References Cited

U.S. PATENT DOCUMENTS

2005/0012161 A1* 1/2005 Sato ........................... 257/393

FOREIGN PATENT DOCUMENTS

| JP | 1024629 | 1/1989 |
|----|---------|--------|
| JP | 02-246421 | 10/1990 |
| JP | 09-107059 | 4/1997 |

* cited by examiner

*Primary Examiner*—Vuthe Siek
(74) *Attorney, Agent, or Firm*—Harness, Dickey & Pierce, P.L.C.

(57) ABSTRACT

Provided is a complementary metal oxide semiconductor (CMOS) inverter layout for increasing an effective channel length. The CMOS inverter layout may include first and second conductive MOS transistors respectively formed in first and second active regions, metal lines electrically connecting the first and second conductive MOS transistors, and one or more gate electrodes electrically connecting the gates of the first and second conductive MOS transistors. The widths of one or more gate electrodes may be set to a reduced and/or minimum feature size to reduce and/or minimize a process variation and a layout area of the CMOS inverter. Also, the first and second conductive MOS transistors may be connected in series via the metal lines to increase an effective channel length, thereby realizing a layout of the CMOS inverter having a longer delay than a conventional CMOS inverter.

17 Claims, 10 Drawing Sheets

CMOS INVERTER LAYOUT FOR INCREASING EFFECTIVE CHANNEL LENGTH

PRIORITY STATEMENT

This application claims priority under 35 U.S.C. §119 from Korean Patent Application No. 10-2006-0032140, filed on Apr. 10, 2006, the entire contents of which is hereby incorporated by reference.

BACKGROUND

1. Field

Example embodiments relate to layouts of a complementary metal oxide semiconductor (CMOS) inverters. More particularly, example embodiments relate to layouts of CMOS inverters, in which the width of a gate electrode has a minimum feature size, as defined below in this application, and an effective channel length is increased to have a longer delay than conventional inverters.

2. Description of the Related Art

As used herein, the terms "minimum feature size" denote a dimension of the smallest feature actually constructed in a semiconductor manufacturing process. Because chipmakers continually seek to provide more circuitry into the same amount of space, there is a general desire to continue reducing the minimum feature size.

In CMOS technology processes, gate electrodes are generally formed of poly silicon. Of course, gate electrodes are not limited being made of poly silicon. In this disclosure, a gate electrode will be referred to as a "poly" and multiple gate electrodes will be referred to as "polies". Accordingly, the width of the gate electrode will be referred to as "poly length". Also, an interval between adjacent polies is referred to herein as a "poly interval". The terms "poly", "polies", "poly length" and "poly interval" as used herein should be understood as being applicable to CMOS circuits having a gate electrode formed of poly silicon as well as a gate electrode formed of materials other than poly silicon.

In CMOS technology processes, if a poly length is about 50 nm, CMOS transistor characteristics tend to be largely influenced by poly intervals. Accordingly, there is a growing desire to reduce a process variation by arranging polies at regular intervals.

Unlike an analog circuit, a digital circuit generally uses a CMOS transistor whose poly length has a minimum feature size. However, some types of digital circuits, such as a hold buffer requiring a long delay, for example, use polies having a length greater than the minimum feature size. To reduce a process variation, poly lengths should be uniform and the polies should be aligned at regular intervals. However, in conventional devices including a first type of circuit requiring a longer and a second type of circuit requiring a shorter delay, difficulties arise when attempting to align the polies of the first type of circuit and the second type of circuit at regular intervals.

FIG. 1 is a circuit diagram representing a conventional inverter 10. Referring to FIG. 1, the conventional inverter 10 includes a PMOS transistor MP1 and an NMOS transistor MN1. The PMOS transistor MP1 is connected between a first line 102 for receiving a first voltage Vdd and an output terminal OUT. The NMOS transistor MN1 is connected between the output terminal OUT and a second line 104 for receiving a second voltage Vss. Further, each gate of a pair of the transistors MP1 and MN1 is connected to an input terminal IN.

FIG. 2 is a diagram illustrating a conventional layout 100 for the inverter 10 of FIG. 1. Referring to FIGS. 1 and 2, the PMOS transistor MP1 is formed in a P active region 101 in an N-well region, and the NMOS transistor MN1 is formed in an N active region 103 in a P-substrate or a P-well region.

A source of the PMOS transistor MP1 is connected to the first line 102 for receiving the first voltage Vdd through a metal line and a via. The drain of the PMOS transistor MP1 is connected to an output terminal OUT and the drain of the NMOS transistor MN1 through a metal line and a via. The source of the NMOS transistor MN1 is connected to the second line 104 for receiving the second voltage Vss through a metal line and a via. Each of the gates of the PMOS transistor MP1 and the NMOS transistor MN1 is connected to the input terminal IN through a poly and via passing through the center of the P active region 101 and the N active region 103.

In the conventional CMOS inverter 10, a channel length may be reduced by setting the poly length to the minimum feature size. Reducing the channel length generally reduces a delay of an output signal.

FIG. 3 is a diagram illustrating another conventional layout 110 of the conventional inverter 10. A comparison of FIG. 2 and FIG. 3 indicates that an inverter 10 having the layout 110 has a longer poly length than an inverter 10 having the layout 100. Further, the active regions and channel widths shown in the layout 110 of FIG. 3 are narrower than the active regions and channel widths shown in the layout 100 of FIG. 2. All other factors being equal, an inverter 10 having the layout 110 of FIG. 3 will have a longer delay than an inverter 10 having the layout 100 because the layout 110 of FIG. 3 has a longer poly length and narrower widths of the active regions and the channels.

Conventionally, if an integrated circuit includes a first type of circuit having an first poly length and a second type of circuit having different poly length, it is difficult, complex and/or expensive to align the polies at regular intervals. For example, if polies having different poly lengths are aligned at regular intervals in an integrated circuit, poly pitch of the integrated circuit is not uniform. In the alternative, if the poly pitch is uniform in an integrated circuit having polies with at least two different poly lengths, the poly intervals are not uniform. In light of the above-identified difficulties, costs, process variations and layout areas for an integrated circuit may increase.

SUMMARY

Example embodiments provide a layout of a complementary metal oxide semiconductor (CMOS) inverter having a longer delay than a conventional CMOS inverter by increasing an effective channel length while setting a poly length to the minimum feature size.

An example embodiment provides a CMOS inverter layout for increasing an effective channel length. The CMOS inverter layout may include i first active regions, where i is a natural number equal to or greater than 2; at least one first gate at least a portion of the at least one first gate intersecting at least two of the first active regions; j first conductive MOS transistors formed in the first active regions, where j is a natural number equal to or greater than i; (i−1) first metal lines electrically connecting the i first active regions; m second active regions, m is a natural number equal to or greater than 2; at least one second gate, at least a portion of the at least one second gate intersecting at least two of the second active regions; n second conductive MOS transistors formed in the second active regions, where n is a natural number equal to or greater than m; and (n−1) second metal lines electrically connecting the n second active regions.

An example embodiment provides a method of fabricating a complementary metal oxide semiconductor (CMOS) inverter. The method may include forming m first active regions and n second active regions, where m and n are natural numbers equal to or greater than 2; forming first conductive MOS transistors in the m first active regions, and second conductive MOS transistors in the n second active regions; and forming (m−1) first metal lines which electrically connect the m first active regions, and (n−1) second metal lines which electrically connect the n second active regions.

An example embodiment provides a CMOS inverter layout. The CMOS inverter layout may include a plurality of first conductive MOS transistors serially connected via at least one first metal line and arranged in a plurality of first active regions having a second conductivity; a plurality of second conductive MOS transistors serially connected via at least one second metal line and arranged in a plurality of second active regions having a first conductivity that is opposite the second conductivity; and a gate electrode connecting all gates of the first conductive MOS transistors and the second conductive MOS. The width of the gate electrode may correspond to a minimum feature size. Further, the gate electrode may include a plurality of branches. Still further, at least one of the first active regions or one of the second active regions may include more than one MOS transistor. Still further, the CMOS inverter layout may include an output metal line connecting a drain of one of the first conductive MOS transistors with a source of one of the second conductive MOS transistor.

BRIEF DESCRIPTION OF THE DRAWINGS

The above and other aspects and advantages of example embodiments will become more apparent from a review of the detailed description that refers to the attached drawings in which.

DETAILED DESCRIPTION OF EXAMPLE EMBODIMENTS

Figure 1:
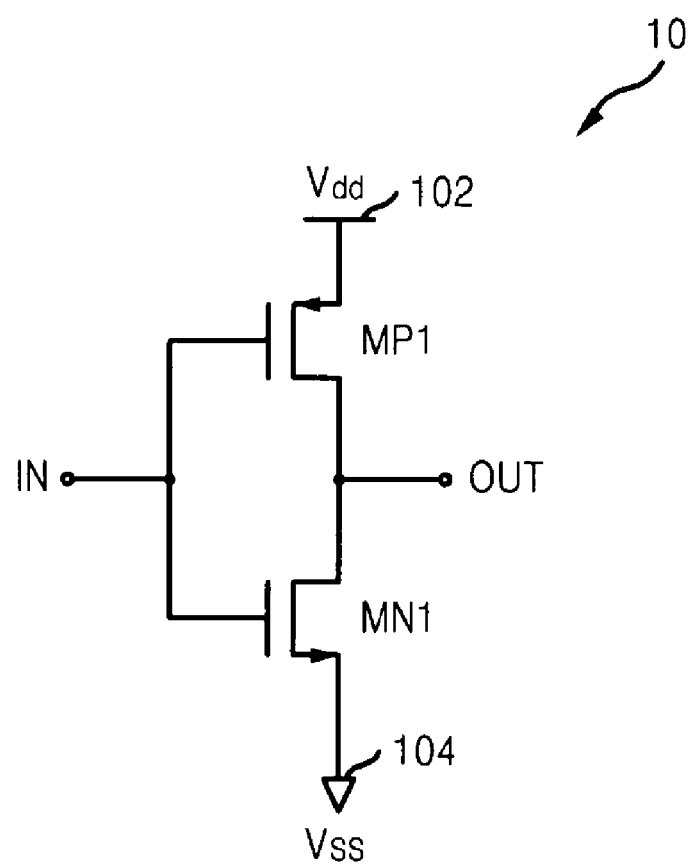
FIG. 1 is a circuit diagram representing a conventional inverter.
Figure 2:
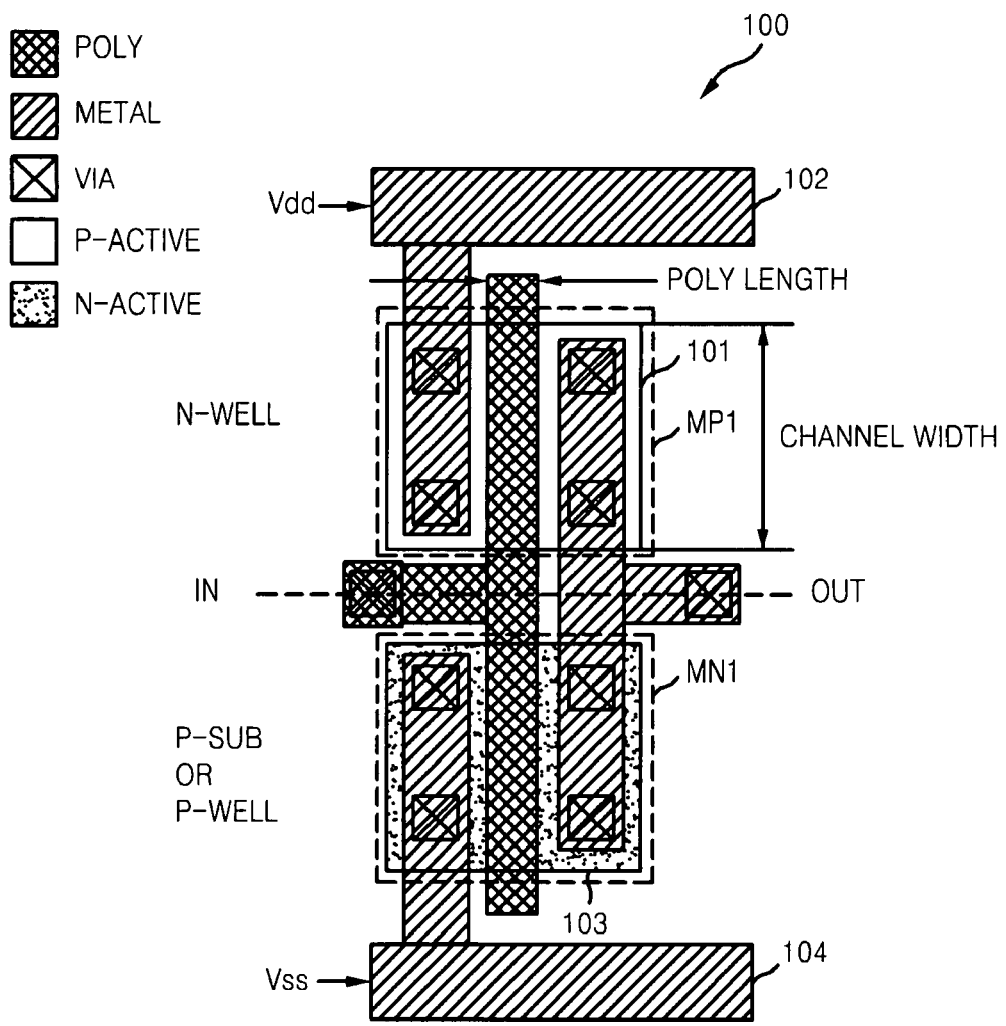
FIG. 2 is a diagram illustrating a conventional layout of the conventional inverter of FIG. 1.
Figure 3:
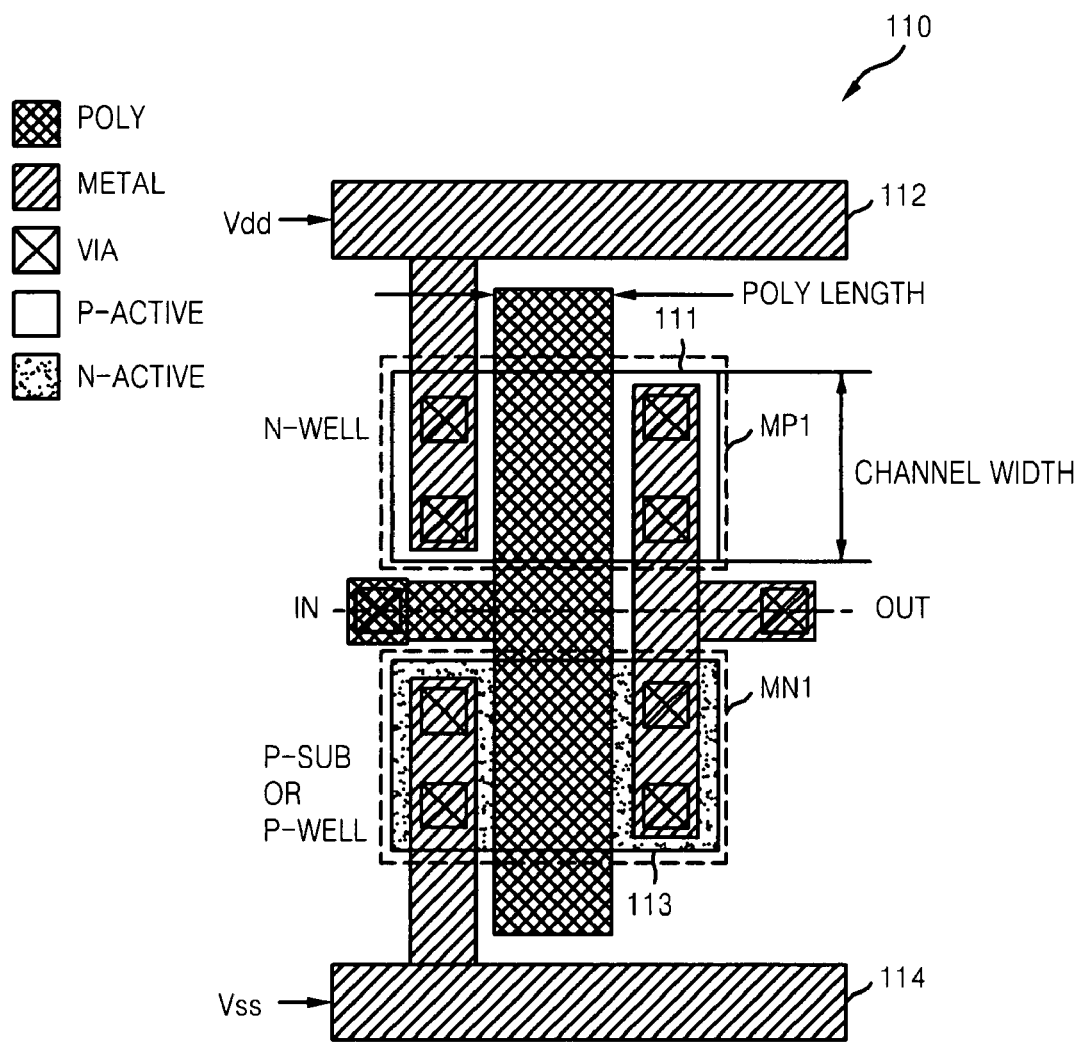
FIG. 3 is a diagram illustrating another conventional layout of the conventional inverter of FIG. 1, which may result in the conventional inverter having a longer delay than an inverter having the layout of FIG. 2.

Example embodiments will now be described more fully with reference to the accompanying drawings, in which example embodiments are shown. Example embodiments may, however, be embodied in many different forms and should not be construed as being limited to the embodiments set forth herein. Rather, these embodiments are provided so that this disclosure will be thorough and complete, and will fully convey the scope of the example embodiments to those skilled in the art.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like reference numerals refer to like elements throughout. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the example embodiments.

Spatially relative terms, such as "beneath," "below," "lower," "above," "upper" and the like, may be used herein for ease of description to describe one element's relationship to another element or elements as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the example embodiments. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to illustrations that are schematic in nature. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, example embodiments will be described in detail with reference to the accompanying drawings. Like reference numerals denote like elements throughout the drawings.

Figure 4:
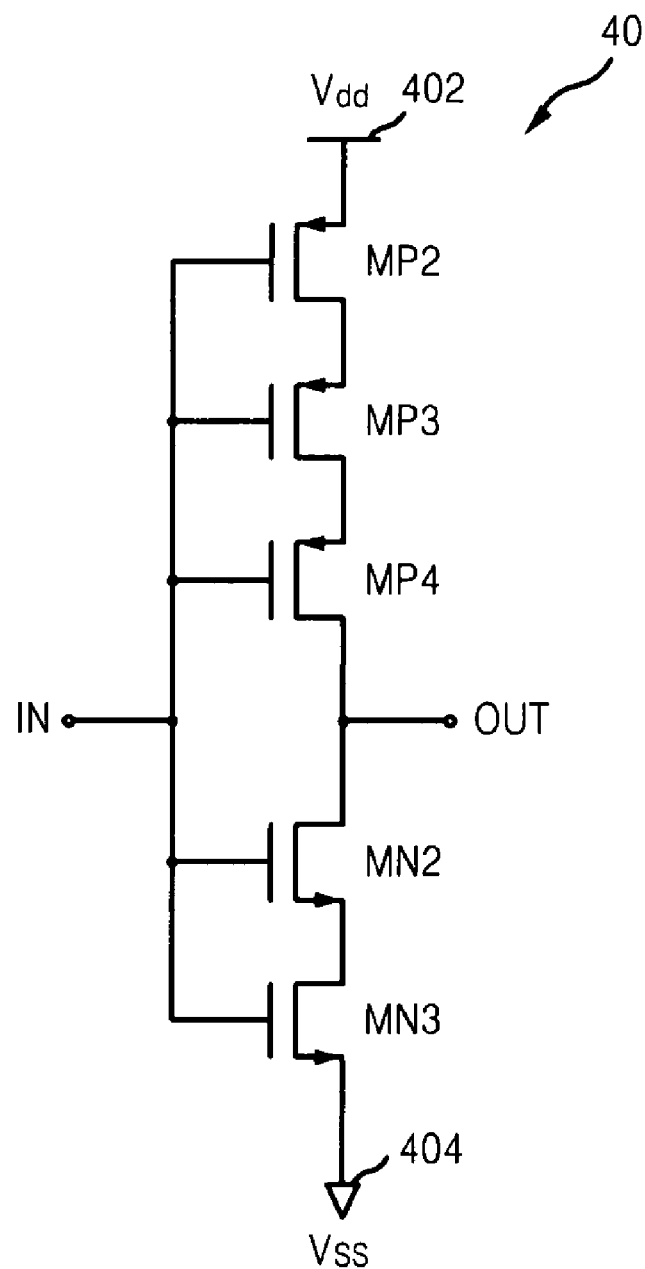
FIG. 4 is a circuit diagram representing an inverter for increasing an effective channel length according to an example embodiment.

FIG. 4 is a circuit diagram representing an inverter 40 for increasing an effective channel length according to an example embodiment. Referring to FIG. 4, the inverter 40 includes first through third PMOS transistors MP2 through MP4 and first and second NMOS transistors MN2 and MN3. The first through third PMOS transistors MP2 and MP4 are connected in series between a first line 402 for receiving a first voltage Vdd and an output terminal OUT. The first and second NMOS transistors MN2 and MN3 are connected in series between the output terminal OUT and a second line 404 for receiving a second voltage Vss. All the gates of the first through third PMOS transistors MP2 through MP4 and the first and second NMOS transistors MN2 and MN3 are connected to an input terminal IN.

Figure 5:
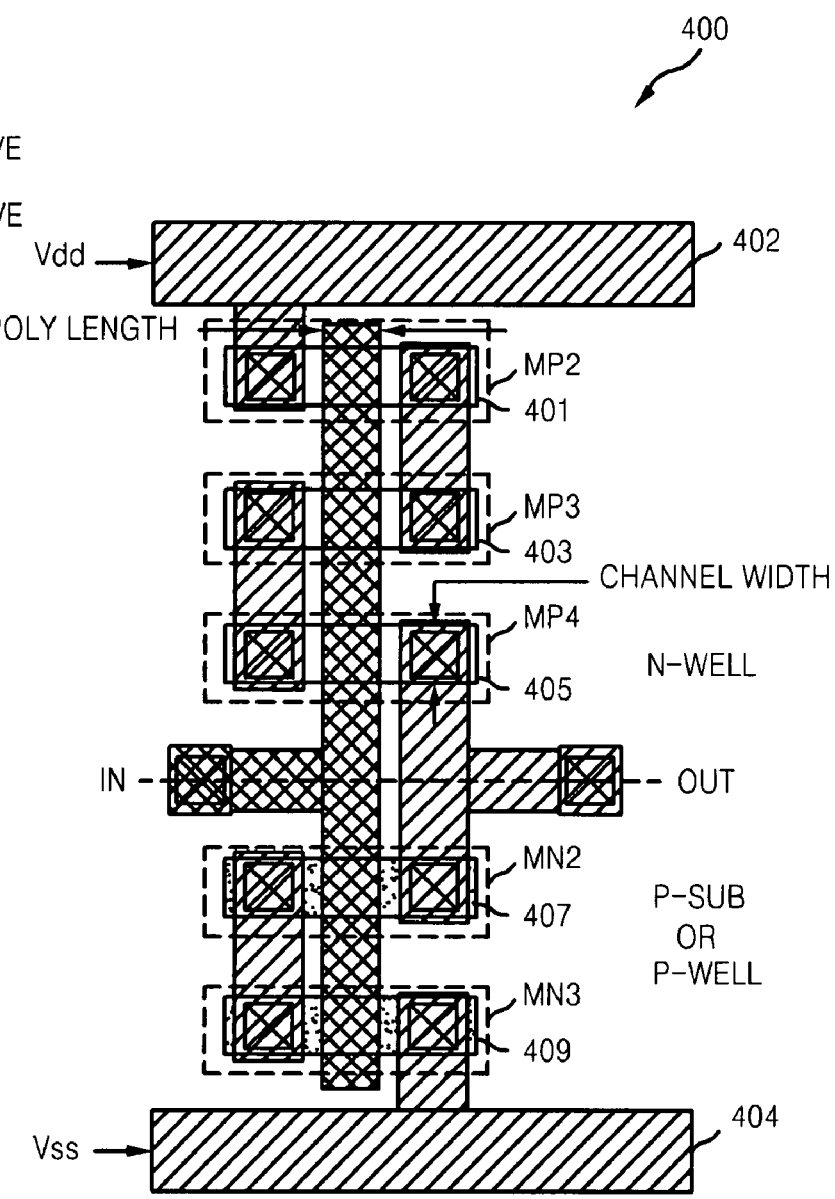
FIG. 5 is a diagram illustrating an example layout of the inverter of FIG. 4 according to an example embodiment.

FIG. 5 is a diagram illustrating an example layout 400 of the inverter 40 of FIG. 4 according to an example embodiment. Referring to FIGS. 4 and 5, the first through third PMOS transistors MP2 through MP4 are respectively formed in three P active regions 401, 403, and 405. Each of the three P active regions 401, 403, and 405 having a desired and/or predetermined width and length. Further, three P active regions 401, 403, and 405 are aligned in parallel in an N-well region at regular intervals. Similarly, the first and second NMOS transistors MN2 and MN3 are respectively formed in a pair of N active regions. The pair including a first N active region 407 and a second N active region 409. Each of the first N active region 407 and the second N active region 409 has a desired and/or predetermined width and length. Further, the first N active region 407 and the second N active region 409 are aligned in parallel in a P-substrate or a P-well region at regular intervals.

In the layout 400 of FIG. 5, the first through third PMOS transistors MP2 through MP4 are connected in series between the first line 402 and the output terminal OUT through metal lines and vias, and the first and second NMOS transistors MN2 and MN3 are connected in series between the output terminal OUT and the second line 404 through metal lines and vias. All the gates of the first through third PMOS transistors MP2 through MP4, and the first and second NMOS transistors MN2 and MN3 are connected. Referring to FIG. 5, all of the gates are connected to the input terminal IN through a poly passing through the centers of the three P active regions 401, 403, and 405 and the pair of the N active regions including the first N active region 407 and the second N active region 409.

According to the example embodiment described referring to FIG. 5, the poly length is set to the minimum feature size so that each poly interval and pitch can be uniform in an integrated circuit, thereby reducing and/or minimizing a process variation. Furthermore, like in other types of logic circuits, the poly length is set to be substantially equal to the minimum feature size and applied to an integrated circuit. Accordingly, even if a voltage of a circuit that uses dynamic voltage scaling (DVS) is lowered, it is possible to reduce and/or prevent excess degradation of the performance due to an increase in a delay in a hold buffer Also, according to the example embodiment described referring to FIG. 5, the widths of the P active regions 401, 403, and 405 and the first and second N active regions 407 and 409 are reduced to reduce a channel width, and the P active regions 401, 403, and 405 and the first and second N active regions 407 and 409 are connected in series to increase an effective channel length and channel capacitance, thereby realizing an inverter having a longer delay than conventional inverters having conventional layouts.

Figure 6:
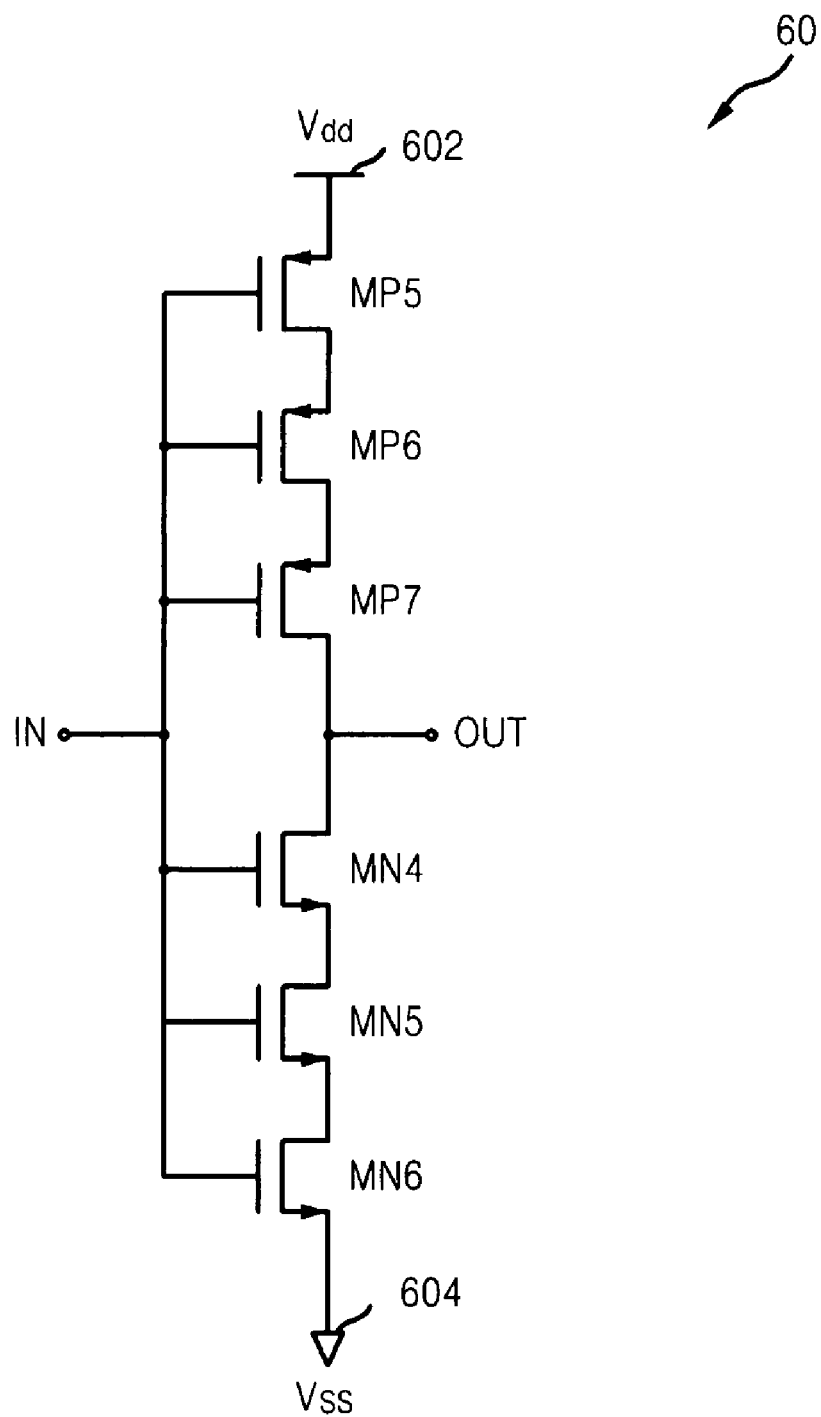
FIG. 6 is a circuit diagram representing an inverter for increasing an effective channel length according to an example embodiment.

FIG. 6 is a circuit diagram representing an inverter 60 for increasing an effective channel length according to an example embodiment. Referring to FIG. 6, the inverter 60 includes fourth through sixth PMOS transistors MP5 through MP7 connected in series between a first line 602 for receiving a first voltage Vdd and an output terminal OUT, and third through fifth NMOS transistors MN4 through MN69 connected in series between the output terminal OUT and a second line 604 for receiving a second voltage Vss. All the gates of the transistors MP5 through MP7, and MN4 through MN6 are connected to an input terminal IN.

Figure 7:
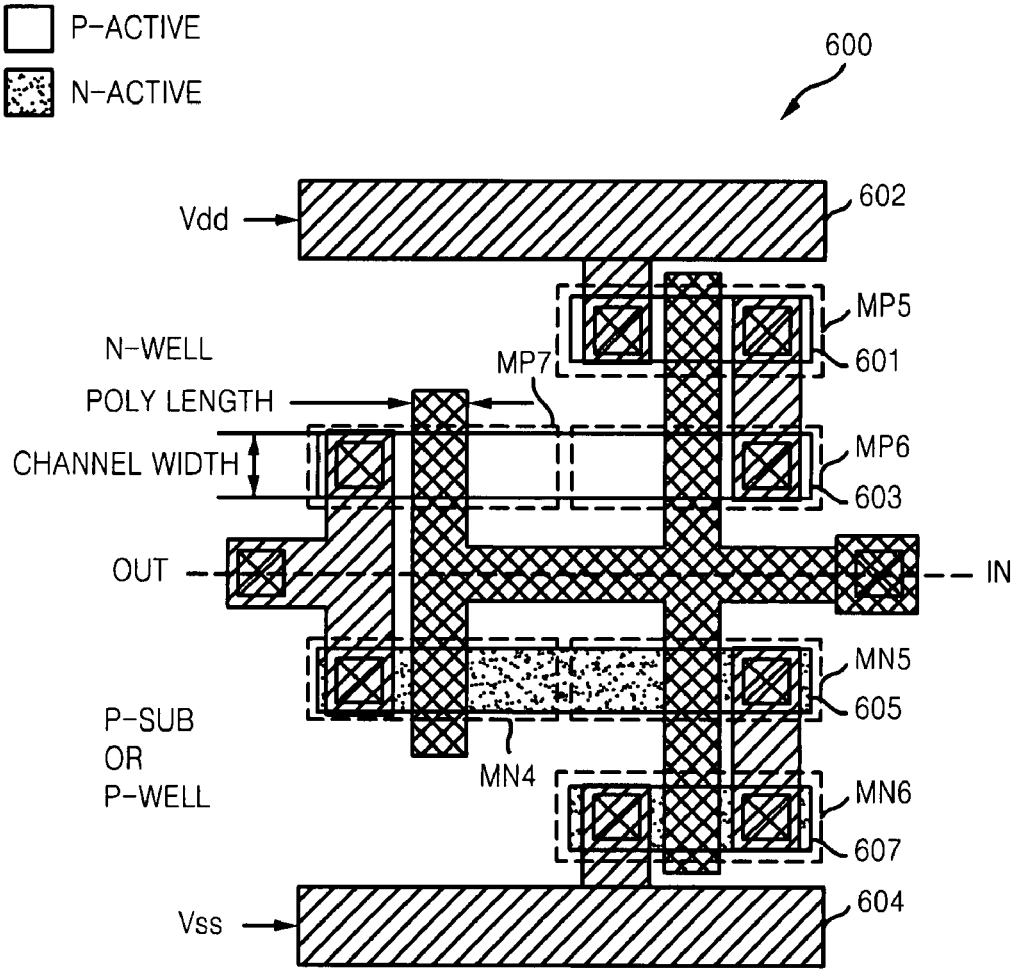
FIG. 7 is a diagram illustrating an example layout of the inverter of FIG. 6 according to an example embodiment.

FIG. 7 is a diagram illustrating an example layout 600 of the inverter 60 of FIG. 6 according to an example embodiment. Referring to FIGS. 6 and 7, the fourth through sixth PMOS transistors MP5 through MP7 are formed in a pair of P active regions. The pair including a first P active region 601 and a second P active region 603. Each of the first P active region 601 and the second P active region 603 has a desired and/or predetermined width and length. Further, the first P active region 601 and the second P active region are arranged at regular intervals in an N-well region. Similarly, the third through fifth NMOS transistors MN4 through MN6 are formed in a pair of N active regions. The pair includes a first N active region 605 and a second N active region 607. Each of the first N active region 605 and the second N active region 607 having a predetermined width and length. Further, the first N active region 605 and the second N active region 607 are arranged at regular intervals in a P-substrate or a P-well region.

Referring to FIG. 7, the fourth PMOS transistor MP5 is formed in the first P active region 601, and the fifth and sixth PMOS transistors MP6 and MP7 are formed in the second P active region 603. Two polies connected each other are formed above the second P active region 603.

A center region of the second P active region 603, which is divided into three parts by the two polies, has a resistance value of several ohms ($\Omega$). The center region acts as the drain of the fifth PMOS transistor MP6 and the source of the sixth PMOS transistor MP7. Therefore, it is possible to draw an effect when the two PMOS transistor MP6 and MP7 are connected in the second P active region 603 in series.

The first P active region 601 and the second P active region 603 are connected between a first line 602 and an output terminal OUT through a metal line and vias, thereby connecting three PMOS transistors MP5 through MP7 in series.

Still referring to layout 600 of FIG. 7, the P-substrate or the P-well region includes a first N active region 605 and a second N active region 607. The third NMOS transistor MN4 and the fourth NMOS transistor MN5 are formed in the first N active region 605, and the fifth NMOS transistor MN6 is formed in the second N active region 607. The third NMOS transistor MN4, the fourth NMOS transistor MN5 and the fifth NMOS transistor MN6 are connected in series between the output terminal OUT and the second line 604.

According to the example embodiment described referring to FIG. 7, the poly length is set to the minimum feature size so that poly intervals and pitch can be uniform in an integrated circuit, thereby reducing and/or minimizing a process variation. Furthermore, like in other types of logic circuits, the poly length is set to be substantially equal to the minimum feature size and applied to an integrated circuit. Accordingly, even if a voltage of a circuit that uses dynamic voltage scaling (DVS) is lowered, it is possible to reduce and/or prevent excess degradation of the performance due to an increase in a delay in a hold buffer.

Also, according to the example embodiment described referring to FIG. 7, the widths of the P and N active regions 601, 603, 605, and 607 are reduced to reduce a channel width, and the P and N active regions 601, 603, 605, and 607 are connected in series to increase an effective channel length and channel capacitance, thereby realizing an inverter having a longer delay than conventional inverters having a conventional layout.

Figure 8:
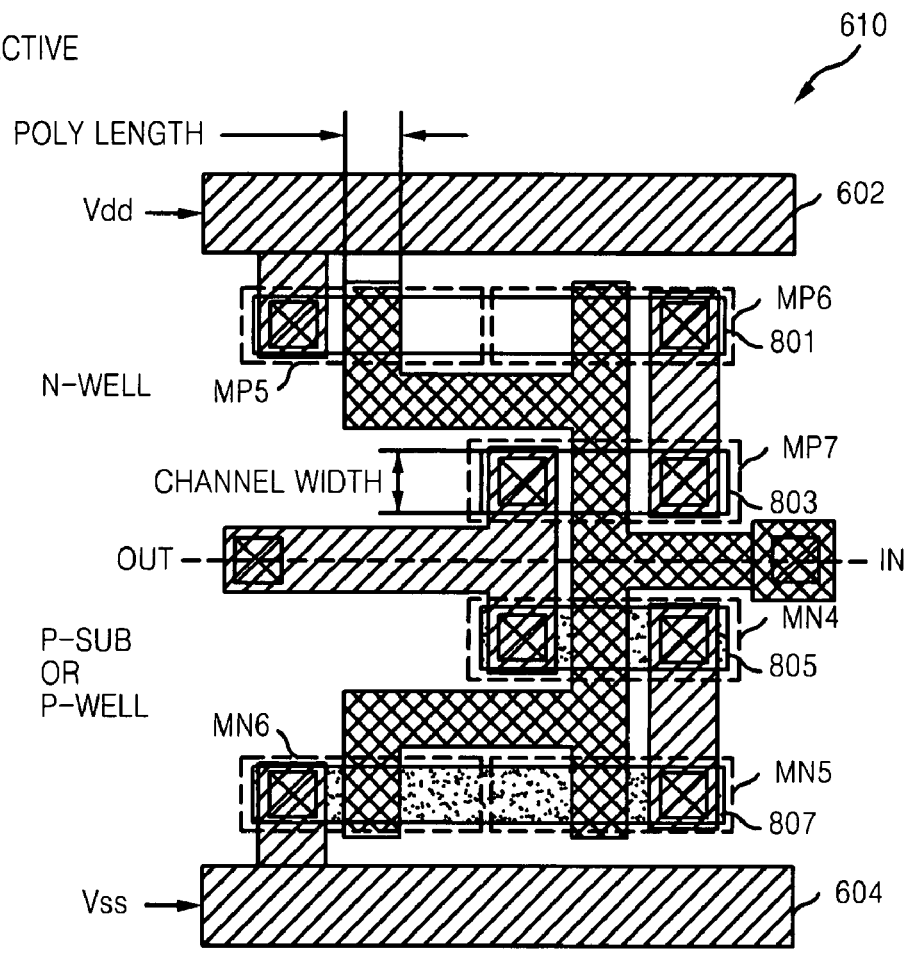
FIG. 8 is a diagram illustrating another example layout of the inverter of FIG. 6 according to an example embodiment.

FIG. 8 is a diagram illustrating another example layout 610 of the inverter 60 of FIG. 6 according to another example embodiment. Referring to FIGS. 6 and 8, the fourth through sixth PMOS transistors MP5 through MP7 are formed in a pair of P active regions. The pair including a first P active region 801 and a second P active region 803. Each of the first P active region 801 and the second P active region has a desired and/or predetermined width and length. Further, the first P active region 801 and the second P active region are aligned in parallel in an N well region at a regular interval. Similarly, the third through fifth NMOS transistors MN4 through MN6 are formed in a pair of N active regions. The pair including a first N active region 805 and a second N active region 807. Each of the first N active region 805 and the second N active region 807 having a desired and/or predetermined width and length. Further, the first N active region 805 and the second N active region 807 are aligned in parallel at regular intervals in a P-substrate or a P well region.

Referring to FIG. 8, the fourth and fifth PMOS transistors MP5 and MP6 are formed in the first P active region 801, and the sixth PMOS transistor MP7 is formed in the second P active region 803. Two polies connected each other are formed above the first P active region 801.

A center region of the first P active region 801, which is divided into three parts by the two polies, has a resistance value of several ohms (Ω). The center region acts as the drain of the fourth PMOS transistor MP5 and the source of the fifth PMOS transistor MP6, thereby obtaining an effect when the fourth PMOS transistor MP5 and the fifth PMOS transistor MP6 are connected in series in the first P active region 801.

The first P active region 801 and the second P active region 803 are connected between the first line 602 and the output terminal OUT through a metal line and vias, thereby connecting the fourth PMOS transistor MP5, fifth PMOS transistor MP6 and sixth PMOS transistor MP7 in series.

Still referring to the layout 610 of FIG. 8, the P substrate or the P-well region includes a first N active region 805 and a second N active region 807. The third NMOS transistor MN4 is formed in the first N active region 805, and the fourth NMOS transistor MN5 and the fifth NMOS transistor MN6 are formed in the second N active region 807. The third NMOS transistor MN4, the fourth NMOS transistor MN5 and the fifth NMOS transistor MN6 are connected in series between the output terminal OUT and the second line 604.

In the example embodiment described referring to FIG. 8, the poly length is set to the minimum feature size so that each poly interval and pitch can be uniform in an integrated circuit, thereby reducing and/or minimizing a process variation. Also, the widths of the active regions 801, 803, 805, and 807 are reduced to reduce a channel width, and the active regions 801, 803, 805, and 807 are connected in series to increase an effective channel length and channel capacitance, thereby realizing an inverter having a longer delay than a conventional inverter having conventional layout.

Figure 9:
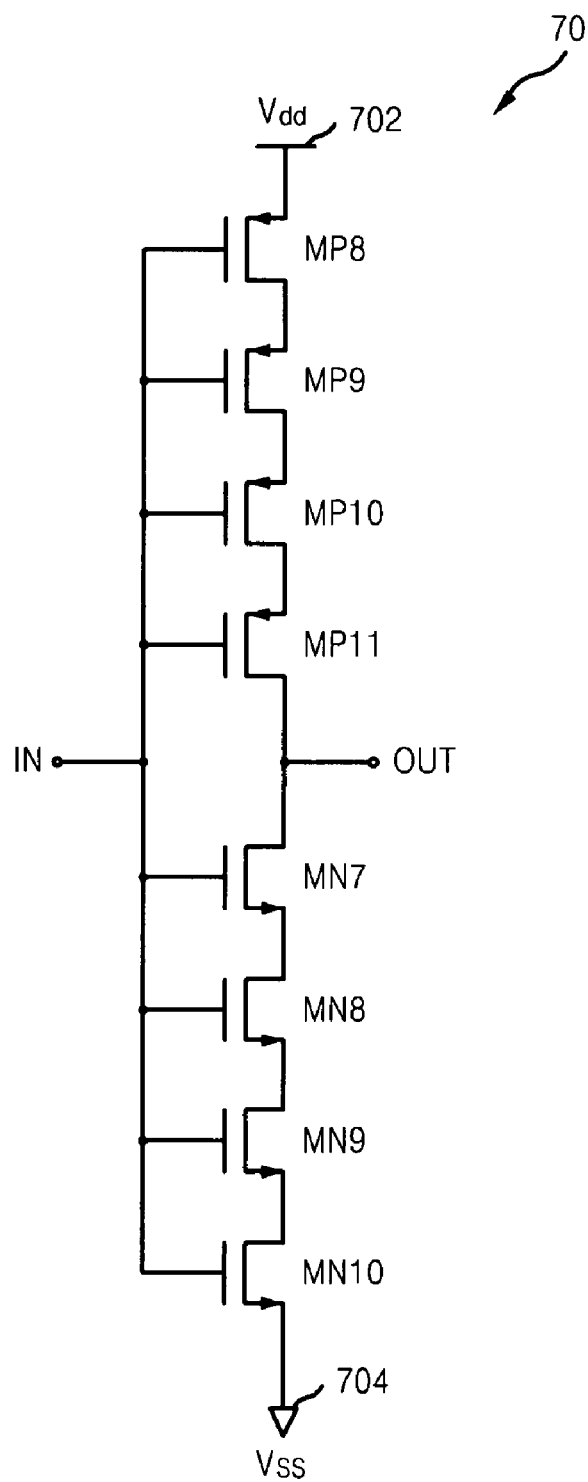
FIG. 9 is a circuit diagram representing an inverter for increasing an effective channel length according to an example embodiment.

FIG. 9 is a circuit diagram representing an inverter 70 for increasing an effective channel length according to an example embodiment. Referring to FIG. 9, the inverter 70 includes seventh through tenth PMOS transistors MP8 through MP11 connected in series between a first line 702 for receiving a first voltage Vdd and an output terminal OUT, and sixth through ninth NMOS transistors MN7 through MN10 connected in series between the output terminal OUT and a second line 704 for receiving a second voltage Vss. All the gates of the transistors MP8 through MP11, and MN7 through MN10 are connected to an input terminal IN.

Figure 10:
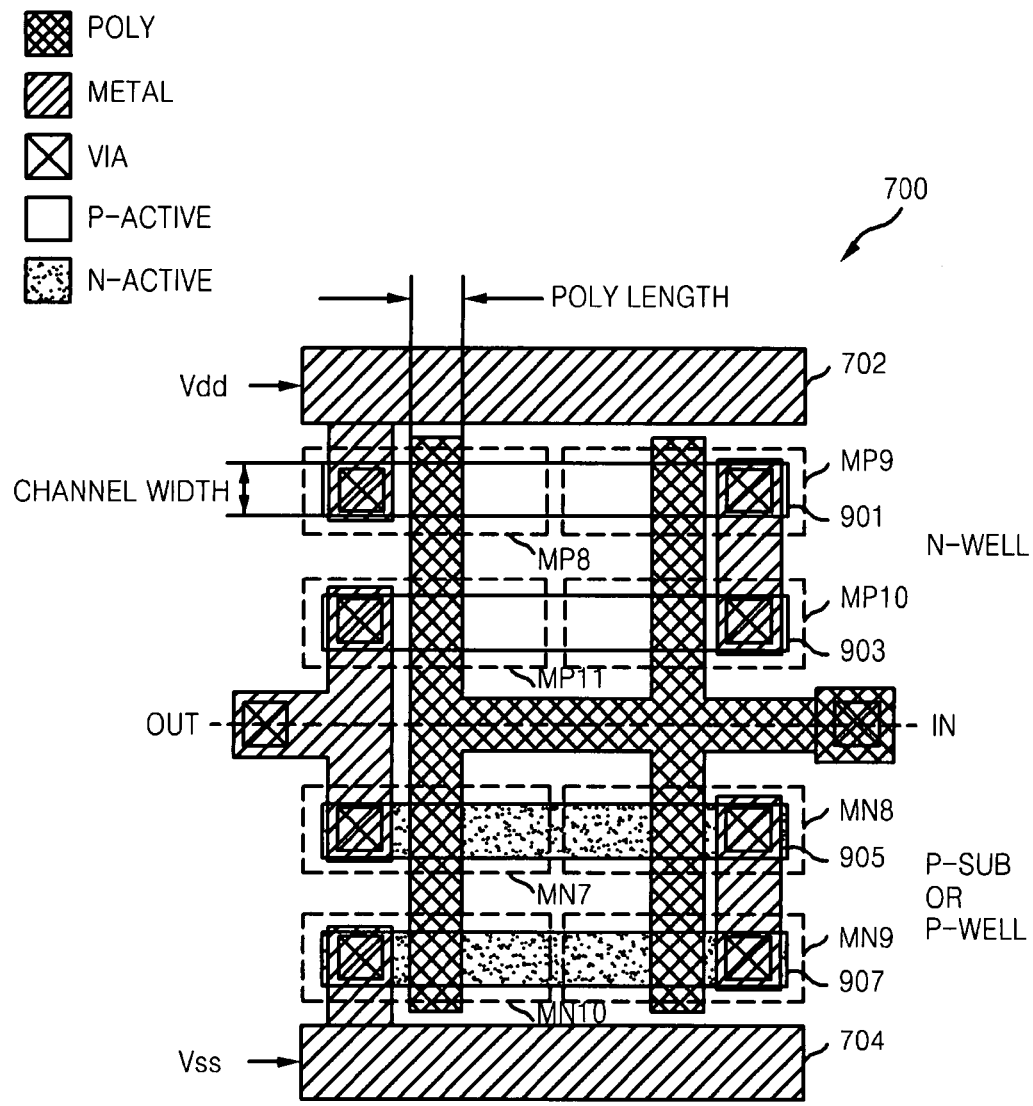
FIG. 10 is a diagram illustrating an example layout of the inverter of FIG. 9 according to an example embodiment.

FIG. 10 is a diagram illustrating an example layout 700 of the inverter 70 of FIG. 9 according to an example embodiment. Referring to FIGS. 9 and 10, the seventh through tenth PMOS transistors MP8 through MP11 are formed in a pair of P active regions. The pair including a first P active region 901 and a second P active region 903. Each of the first P active region 901 and the second P active region 903 has a desired and/or predetermined width and length. Further, the first P active region 901 and the second P active region 903 are aligned in parallel in an N well region at regular intervals. Similarly, the sixth through ninth NMOS transistors MN7 through MN10 are formed in a pair of N active regions. The pair including a first N active region 905 and a second N active region 907. Each of the first N active region 905 and the second N active region 907 has a desired and/or predetermined width and length. Further, the first N active region 905 and the second N active region 907 are aligned in parallel in a P-substrate or a P well region at regular intervals.

Referring to FIG. 10, the seventh PMPS transistor MP8 and the eight PMOS transistor MP9 are formed in the first P active region 901. Further, the ninth PMOS transistor MP10 and the tenth PMOS transistor MP11 are formed in the second P active region 903. Two polies connected each other are formed above both the first P active region 901 and the second P active region 903.

A center region of each of the first P active region 901 and the second P active region 903 is divided into three parts by two polies. The center regions have a resistance value of several ohms (Ω). The center portion of the first P active region 901 acts as the drain of the seventh PMOS transistor MP8 and the source of the eighth PMOS transistor MP9, and the center portion of the second P active region 903 acts as the drain of the ninth PMOS transistor MP10 and the source of the tenth PMOS transistors MP11. Therefore, it is possible to obtain an effect when the seventh and eighth PMOS transistors MP8 and MP9 are connected in series in the first P active region 901, and the ninth and tenth PMOS transistors MP10 and MP11 are connected in series in the second P active region 903

The first P active region 901 and the second P active region 903 are connected in series between the first line 702 and an output terminal OUT through a metal line and vias, thereby connecting the four PMOS transistors MP8 through MP11 in series.

Still referring to the layout 700 in FIG. 10, P-substrate or P-well includes a first N active region 905 and a second N active region 907. The sixth NMOS transistor MN7 and the seventh NMOS transistor MN8 are formed in the first N active region 905, and the eighth NMOS transistor MN9 and the ninth NMOS transistor MN10 are formed in the second N active region 907. The four NMOS transistors MN7 through MN10 are connected in series between the output terminal OUT and the second line 704.

According to the example embodiment described referring to FIG. 10, the poly length is set to the minimum feature size so that each poly intervals and/or a poly pitch can be uniform in an integrated circuit, thereby reducing and/or minimizing a process variation.

Also, the widths of the P and N active regions 901, 903, 905 and 907 are reduced to reduce a channel length, and the P and N active regions 901, 903, 905 and 907 are connected in series to increase an effective channel length and a channel capacitance, thereby realizing an inverter having a longer delay than a conventional inverter having a conventional layout.

As described above, in the layout of a complementary metal oxide semiconductor (CMOS) inverter according to example embodiments, an effective channel length is increased to have a longer delay than a conventional CMOS inverter, but the poly length is set to the minimum feature size so that polies are aligned in a regular pitch and at regular intervals in an integrated circuit, thereby reducing and/or minimizing a process variation and reducing the layout area.

While example embodiments have been particularly shown and described with reference to the figures, it will be understood by those skilled in the art that various changes in form and details may be made therein without departing from the spirit and scope of the invention as defined by the appended claims.

What is claimed is:

1. A complementary metal oxide semiconductor (CMOS) inverter layout comprising:
    i first active regions, where i is a natural number equal to or greater than 2;
    j first conductive MOS transistors formed in the first active regions, where j is a natural number equal to or greater than i;
    (i−1) first metal lines electrically connecting the i first active regions;
    m second active regions, m is a natural number equal to or greater than 2, the first active regions and the second active regions are connected in series;
    n second conductive MOS transistors formed in the second active regions, where n is a natural number equal to or greater than m;
    (m−1) second metal lines electrically connecting the m second active regions; and
    at least one gate, at least a portion of the at least one gate intersecting at least two of the first active regions and the second active regions, wherein
        a width of the at least one gate corresponds to a minimum feature size, and
        the i first active regions are aligned in parallel at regular intervals in an N-well region and the m second active regions are aligned in parallel at regular intervals in a P-substrate or a P-well region.

2. The CMOS inverter layout of claim 1, wherein at least one of the first metal lines overlaps a pair of the first active regions creating a first overlap region in one of the pair and a second overlap region in another of the pair, the first overlap region being a first conductive drain region and the second overlap region being a first conductive source region.

3. The CMOS inverter layout of claim 2, wherein at least one of the first conductive drain region and the first conductive source region is located on an end of one of the first active regions.

4. The CMOS inverter layout of claim 1, wherein at least one of the second metal lines overlaps a pair of the second active regions creating a first overlap region in one of the pair and a second overlap region in another of the pair, the first overlap region being a second conductive drain region and the second overlap region being a second conductive source region.

5. The CMOS inverter layout of claim 4, wherein at least one of the second conductive drain region and the second conductive source region is located at an end of one of the second active regions.

6. The CMOS inverter layout of claim 1, wherein the same signal is applied to the first active regions and the second active regions through the at least one gate.

7. The CMOS inverter layout of claim 1, wherein a first conductive drain region of a $j^{th}$ first MOS transistor and a second conductive drain region of an $n^{th}$ second MOS transistor are electrically connected via a drain electrode.

8. The CMOS inverter layout of claim 7, wherein at least one of the first and second metal lines have the same voltage level as the drain electrode.

9. A method of fabricating a complementary metal oxide semiconductor (CMOS) inverter, comprising:
    forming m first active regions and n second active regions, where m and n are natural numbers equal to or greater than 2, the m first active regions are aligned in parallel at regular intervals in an N-well region and the n second active regions are aligned in parallel at regular intervals in a P-substrate or a P-well region;
    forming first conductive MOS transistors in the m first active regions on a semiconductor substrate using a computing device, and second conductive MOS transistors in the n second active regions; and
    forming (m−1) first metal lines which electrically connect the m first active regions, and (n−1) second metal lines which electrically connect the n second active regions, wherein forming the first and second conductive MOS transistors includes,
        forming at least one gate having at least a portion intersecting the at least two of the first and second active regions, the at least one gate corresponding to a minimum feature size.

10. The method of claim 9, wherein the widths of each of the at least one first gate and the at least one second gate corresponds to a minimum feature size.

11. The method of claim 9, wherein at least one of the first metal lines overlaps a pair of the first active regions creating a first overlap region in one of the pair and a second overlap region in another of the pair, the first overlap region being a first conductive drain region and the second overlap region being a first conductive source region.

12. The method of claim 9, wherein at least one of the second metal lines overlaps a pair of the second active regions creating a first overlap region in one of the pair and a second overlap region in another of the pair, the first overlap region being a second conductive drain region and the second overlap region being a second conductive source region.

13. A complementary metal oxide semiconductor (CMOS) inverter layout comprising:
    a plurality of first conductive MOS transistors serially connected via at least one first metal line and arranged in a plurality of first active regions having a second conductivity;
    a plurality of second conductive MOS transistors serially connected via at least one second metal line and arranged in a plurality of second active regions having a first conductivity that is opposite the second conductivity; and a gate electrode connecting a plurality of gates of the first conductive MOS transistors and the second conductive MOS transistors, the gate electrode intersecting at least two of the first active regions and the second active regions, wherein a width of the gate electrode corresponds to a minimum feature size, and the plurality of first active regions are aligned in parallel at regular intervals in an N-well region and the plurality of second active regions are aligned in parallel at regular intervals in a P-substrate or a P-well region.

14. The CMOS inverter layout of claim 13, wherein the gate electrode includes a plurality of branches.

15. The CMOS inverter layout of claim 13, wherein at least one of the plurality of first active regions includes at least two first conductive MOS transistors.

16. The CMOS inverter layout of claim 13, wherein at least one of the plurality of second active regions includes at least two second conductive MOS transistors.

17. The CMOS inverter layout of claim 13, further comprising an output metal line connecting a drain of one of the first conductive MOS transistors with a source of one of the second conductive MOS transistors.

* * * * *